(12) United States Patent
Hammerschmidt

(10) Patent No.: US 10,637,497 B2
(45) Date of Patent: *Apr. 28, 2020

(54) RECEIVER, SENDER, METHOD FOR RETRIEVING AN ADDITIONAL DATUM FROM A SIGNAL AND METHOD FOR TRANSMITTING A DATUM AND AN ADDITIONAL DATUM IN A SIGNAL

(71) Applicant: Infineon Technologies AG, Neubiberg (DE)

(72) Inventor: Dirk Hammerschmidt, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/840,574

(22) Filed: Dec. 13, 2017

(65) Prior Publication Data

US 2018/0102786 A1  Apr. 12, 2018

Related U.S. Application Data

(63) Continuation of application No. 14/933,349, filed on Nov. 5, 2015, now Pat. No. 9,882,579.

(30) Foreign Application Priority Data

Nov. 19, 2014 (DE) .............................. 102014116909

(51) Int. Cl.
*H03M 5/02* (2006.01)
*H03M 5/22* (2006.01)

(52) U.S. Cl.
CPC .............. *H03M 5/02* (2013.01); *H03M 5/22* (2013.01)

(58) Field of Classification Search
CPC ... H04B 1/02; H04B 1/06; H04B 1/16; H04B 17/21; H04L 25/069; H04L 25/4902
See application file for complete search history.

(56) References Cited

U.S. PATENT DOCUMENTS

| 5,206,636 A * | 4/1993 | Henry .................... H04L 25/069 340/7.33 |
| 5,315,299 A * | 5/1994 | Matsumoto ........... H03M 5/145 341/53 |
| 5,390,179 A * | 2/1995 | Killian ....................... H04J 3/14 340/7.22 |
| 5,506,960 A * | 4/1996 | Meare .................. G06F 11/0736 714/45 |
| 5,797,038 A * | 8/1998 | Crawford ............ G06F 13/4291 710/48 |

(Continued)

FOREIGN PATENT DOCUMENTS

| DE | 102008064747 B3 | 12/2012 | |
| DE | 102014116909 A1 * | 5/2016 | .............. H03M 5/02 |
| JP | 1093946 A | 4/1998 | |
| WO | WO-2014138334 A1 * | 9/2014 | ........... H04L 7/0331 |

OTHER PUBLICATIONS

J2716—Sent for Automotive Applications, issued Apr. 2007.pdf (Year: 2007).*

(Continued)

*Primary Examiner* — Berhanu Tadese
(74) *Attorney, Agent, or Firm* — Eschweiler & Potashnik, LLC

(57) ABSTRACT

A receiver includes a receiver circuit to receive a first transition in a first direction, a second transition in a second, different direction after the first transition and a third transition in the first direction after the second transition of a signal. A first time period between the first and third transitions is indicative of a datum to be received. The receiver circuit is also configured to determine a second time period between the first transition and a second transition and to determine an additional datum to be received based at least on the determined second time period between the first and second transitions. Using the determined second time period allows for more information to be received in a reliable manner.

20 Claims, 8 Drawing Sheets

(56) References Cited

U.S. PATENT DOCUMENTS

| | | | | |
|---|---|---|---|---|
| 5,903,607 | A * | 5/1999 | Tailliet | H04B 3/548 340/12.37 |
| 6,054,927 | A * | 4/2000 | Brickell | G01S 17/026 340/552 |
| 6,298,291 | B1 * | 10/2001 | Davis, Jr. | B60H 1/008 180/68.2 |
| 6,873,642 | B1 * | 3/2005 | Fey | H04L 25/493 375/238 |
| 7,072,415 | B2 * | 7/2006 | Zerbe | G11C 7/1051 375/286 |
| 7,221,295 | B2 * | 5/2007 | Carley | H03M 5/08 341/100 |
| 7,873,139 | B2 * | 1/2011 | Matsuno | H04W 52/0229 377/19 |
| 7,893,717 | B1 * | 2/2011 | Meany | H04L 25/4902 326/82 |
| 7,957,455 | B2 * | 6/2011 | Paul | H04L 7/0029 375/148 |
| 8,035,746 | B2 * | 10/2011 | Cai | H04N 9/896 348/572 |
| 8,832,474 | B2 * | 9/2014 | Noller | H04L 12/40039 713/310 |
| 8,842,026 | B2 * | 9/2014 | Levy | H03M 1/1057 341/118 |
| 8,942,281 | B2 * | 1/2015 | Daecke | H04L 25/03878 375/232 |
| 9,172,565 | B2 * | 10/2015 | Cadugan | H04L 7/042 |
| 9,374,174 | B1 * | 6/2016 | Hammerschmidt | H04B 14/026 |
| 9,383,425 | B2 * | 7/2016 | Milano | G01R 33/072 |
| 9,634,715 | B2 * | 4/2017 | Scheinkerman | H04B 1/40 |
| 9,667,409 | B2 * | 5/2017 | Scherr | H04L 5/1484 |
| 9,692,623 | B2 * | 6/2017 | Hammerschmidt | H03K 7/08 |
| 9,882,579 | B2 * | 1/2018 | Hammerschmidt | H03M 5/22 |
| 2003/0091137 | A1 * | 5/2003 | Vallet | H04L 7/0338 375/360 |
| 2003/0161411 | A1 * | 8/2003 | McCorkle | G01S 7/023 375/295 |
| 2004/0223545 | A1 * | 11/2004 | Lee | H03M 3/506 375/238 |
| 2005/0212932 | A1 * | 9/2005 | Steimle | H04N 5/23241 348/246 |
| 2005/0242857 | A1 * | 11/2005 | Minzoni | H03K 5/135 327/172 |
| 2006/0153530 | A1 * | 7/2006 | Cai | H04N 9/896 386/208 |
| 2008/0025436 | A1 * | 1/2008 | Leutgeb | H04L 27/06 375/317 |
| 2008/0192873 | A1 * | 8/2008 | Tamura | H04L 7/0338 375/355 |
| 2008/0312860 | A1 * | 12/2008 | Bauerle | G01D 18/004 702/85 |
| 2009/0046773 | A1 * | 2/2009 | Scherr | H04L 5/1484 375/238 |
| 2009/0138748 | A1 * | 5/2009 | Kim | G06F 1/08 713/503 |
| 2009/0210602 | A1 * | 8/2009 | von Wendorff | G06F 15/7853 710/305 |
| 2009/0267673 | A1 * | 10/2009 | Kamenicky | H04B 3/00 327/291 |
| 2009/0307400 | A1 * | 12/2009 | Machauer | H04L 12/403 710/110 |
| 2010/0002821 | A1 * | 1/2010 | Hammerschmidt | H04L 7/10 375/360 |
| 2010/0007543 | A1 * | 1/2010 | Mueck | H03M 1/1235 341/200 |
| 2010/0279732 | A1 * | 11/2010 | Hjelm | G01S 19/06 455/552.1 |
| 2011/0026411 | A1 * | 2/2011 | Hao | H04L 12/40189 370/249 |
| 2011/0176589 | A1 * | 7/2011 | Kolof | H04L 7/042 375/224 |
| 2011/0310954 | A1 * | 12/2011 | Sawaoka | H03K 7/08 375/238 |
| 2012/0036922 | A1 * | 2/2012 | Bauerle | G01M 15/02 73/114.36 |
| 2012/0093312 | A1 * | 4/2012 | Gammel | H04L 9/0631 380/255 |
| 2012/0114033 | A1 * | 5/2012 | Chen | G10K 11/178 375/238 |
| 2012/0155645 | A1 * | 6/2012 | Prochaska | H04L 63/0435 380/278 |
| 2012/0158335 | A1 * | 6/2012 | Donovan | G05B 19/0423 702/79 |
| 2012/0195400 | A1 * | 8/2012 | Tomar | H04L 7/0331 375/354 |
| 2012/0249133 | A1 * | 10/2012 | Friedrich | G01R 33/0005 324/247 |
| 2012/0314738 | A1 * | 12/2012 | Kashima | H04L 12/403 375/219 |
| 2013/0034132 | A1 * | 2/2013 | Kaneko | H04L 12/10 375/219 |
| 2013/0343472 | A1 * | 12/2013 | Scherr | H04L 5/1484 375/259 |
| 2013/0345924 | A1 * | 12/2013 | Tomar | G01P 15/125 701/30.5 |
| 2014/0157035 | A1 * | 6/2014 | Vowe | G06F 13/382 713/401 |
| 2014/0169423 | A1 * | 6/2014 | Scherr | H04L 5/1484 375/219 |
| 2014/0214970 | A1 * | 7/2014 | Rasbornig | H04B 1/16 709/206 |
| 2014/0241414 | A1 * | 8/2014 | Reidl | H04L 25/4902 375/238 |
| 2014/0245280 | A1 | 8/2014 | Chen et al. | |
| 2014/0254731 | A1 | 9/2014 | Bowling et al. | |
| 2014/0320100 | A1 * | 10/2014 | Congiu | H02M 3/157 323/282 |
| 2015/0194992 | A1 * | 7/2015 | Rasbornig | H04B 1/16 375/316 |
| 2015/0236746 | A1 * | 8/2015 | Scheinkerman | H04B 1/40 375/219 |
| 2015/0236876 | A1 * | 8/2015 | Cadugan | H04L 25/03834 375/242 |
| 2015/0270994 | A1 * | 9/2015 | Scherr | H04L 25/4902 375/238 |
| 2015/0358150 | A1 * | 12/2015 | Meng | H03M 9/00 375/362 |
| 2016/0020797 | A1 * | 1/2016 | Hammerschmidt | H04L 25/069 375/316 |
| 2016/0087672 | A1 * | 3/2016 | Hammerschmidt | H04W 4/00 375/296 |
| 2016/0094370 | A1 * | 3/2016 | Rasbornig | H04L 25/4902 375/238 |
| 2016/0098374 | A1 * | 4/2016 | Drescher | H04L 12/403 710/313 |
| 2016/0103173 | A1 * | 4/2016 | Morici | G01R 31/006 324/750.3 |
| 2016/0119006 | A1 * | 4/2016 | Hammerschmidt | H04B 1/16 375/316 |
| 2016/0142071 | A1 * | 5/2016 | Hammerschmidt | H03K 7/08 375/238 |
| 2016/0142080 | A1 * | 5/2016 | Hammerschmidt | H03M 5/22 375/340 |
| 2018/0067153 | A1 * | 3/2018 | Kolof | H04L 1/20 |
| 2018/0102786 | A1 * | 4/2018 | Hammerschmidt | H03M 5/22 |
| 2018/0123823 | A1 * | 5/2018 | Scherr | H04L 12/40019 |
| 2019/0227896 | A1 * | 7/2019 | Scherr | G06F 11/0745 |

OTHER PUBLICATIONS

Vincent Hiligsmann, Digital Communication for Smart Modern Sensors Contributed, Digi-Key Electronics, May 6, 2011—Inernet Citation—(Year: 2011).*

Anthony Seely, Multi-Channel SAE-J2716 (SENT) Decoder Using NHET, Texas Instruments MCU Automotive Systems, Jul. 2010 (Year: 2010).*

(56) References Cited

OTHER PUBLICATIONS

SENT-SPC Driver for the MPC5510 Microcontroller Family, Freescale 2010 (Year: 2010).*
"SAE International, Surface Vehicle Information Report." J2716 PropDft xxx201x. Apr. 2007, http://www.sae.org, 103 pages.
SAE International, Surface Vehicle Information Report. J2716 Revised PropDft, Apr. 2010.
"Multi-Channel SAE-J2716 (SENT) Decoder Using NHET"; Texas Instruments; Jul. 2010, p. 1-19.
Final Office Action dated May 4, 2017 for U.S. Appl. No. 14/933,349.
Non-Final Office Action dated Sep. 22, 2016 for U.S. Appl. No. 14/933,349.
Corrected Notice of Allowability dated Nov. 27, 2017 for U.S. Appl. No. 14/933,349.
Notice of Allowance dated Sep. 18, 2017 for U.S. Appl. No. 14/933,349.

* cited by examiner

RECEIVER, SENDER, METHOD FOR RETRIEVING AN ADDITIONAL DATUM FROM A SIGNAL AND METHOD FOR TRANSMITTING A DATUM AND AN ADDITIONAL DATUM IN A SIGNAL

CROSS REFERENCE TO RELATED APPLICATIONS

This application is a continuation of U.S. application Ser. No. 14/933,349 filed on Nov. 5, 2015, which claims priority to German Application No. 10 2014 116 909.3, filed on Nov. 19, 2014, and incorporated herein by reference in its entirety.

FIELD

Embodiments relate to a receiver, a sender, a method for retrieving an additional datum from a signal, a method for transmitting a datum and an additional datum in a signal and corresponding computer-, processor- and programmable hardware-related implementations.

BACKGROUND

In many fields of technology, data are transmitted from one entity to another entity using a digital encoding scheme. While in some of these applications highly sophisticated transmission schemes are employed, in many fields a tendency exists to enable a digital transmission using a more simple and yet robust protocol allowing both, a high throughput and a simple implementation. Therefore, a general demand exists to improve a trade-off between robustness of transmission with respect to distortions, simplicity of implementation and a high throughput.

For instance, in the field of high volume architectures using low cost implementations, finding a solution for this trade-off may be more relevant than in other fields of technology. For instance, in the field of communication systems for motorized or non-motorized vehicles, different components including sensors, control units and other devices often require a communication architecture allowing a transmission of data robust against distortions even under tough operating conditions. Nevertheless, such an architecture should provide enough bandwidth to allow different entities to transmit data. Due to the higher volume of these components used in even a single vehicle, a simple and hence cost-efficient implementation may also be important. An example comes from the automotive sector, where sensors, control units and other devices need to communicate with one another or at least provide data in one direction.

However, also in other fields of technology a comparable demand exists including also non-high volume architectures and systems.

SUMMARY

A receiver according to an embodiment comprises a receiver circuit to receive a first transition in a first direction, a second transition in a second direction after the first transition and a third transition in the first transition after the second transition of a signal, in which a first time period between the first and third transitions is at least partially indicating a datum to be received. The receiver circuit is configured to determine a second time period between the first transition and a second transition and to determine an additional datum to be received based at least on the determined second time period between the first and second transitions.

By using a receiver according to an embodiment, the time interval between the first and second transitions may additionally be used to transmit the additional datum, which may lead to a higher throughput of data. Moreover, it may be possible to limit the impact on the robustness of the transition scheme and the simplicity of a corresponding implementation.

Optionally, the receiver circuit may further be configured to determine the first time period between the first and third transitions and to determine the datum based at least on the determined first time period. In other words, the receiver may be capable of determining or retrieving the datum from the signal.

Optionally, the receiver circuit may be configured to determine the first transition and the third transition as transitions from a common predefined first signal level to a common predefined second signal level. This may allow an even more robust transmission of the datum.

Optionally, the receiver circuit may be configured to determine the second time period—between the first and second transitions—being shorter than a minimum period of time after the first transition for a transition to the first level according to a predefined or predetermined specification or protocol for transmitting the datum. For instance, it may be possible to violate a downward compatibility with respect to a protocol for transmitting the datum, which may allow to even increase the throughput of data further. However, depending on the robustness of such a legacy implementation, it may be possible for such a receiver to simply ignore the modification of the second transition. This may allow a downward compatibility.

Additionally or alternatively, in such a receiver the receiver circuit may be configured to determine the second time period based on the second transition to an intermediate signal level different from the first signal level and the second signal level. This may further improve a downward compatibility by using the intermediate signal level being different from the first and second signal levels. Additionally or alternatively, it may allow increasing the bandwidth for the additional datum. In such an implementation, the second transition may be a transition, which does not end at the first and second signal levels. The intermediate signal level may be a signal level arranged between the first and second signal levels.

Additionally or alternatively, the receiver circuit may be configured to determine the second time period between the first and second transitions based on an amplitude of a second transition. The receiver circuit may further be configured to determine the additional datum based on at least two different amplitudes of a second transition. Therefore, it may therefore be possible to increase the throughput or bandwidth of the transition scheme even further by additionally allowing the second transition to comprise different amplitudes to allow the throughput of data to be increased by using an amplitude modulation scheme additionally.

Naturally, in other embodiments, the receiver circuit may also be configured to determine the second time period between the first and second transitions based on the second transition always comprising the same amplitude. This may allow a receiver to be more compatible to legacy protocols. Additionally or alternatively, this may allow the transmission protocol to be more robust against distortions since the amplitude does not comprise pieces of information in this case.

Additionally or alternatively, the receiver circuit may be configured to determine the datum based on the first time period between the first and third transitions, which is variable and depending on the datum. In other words, the datum to be received by the receiver is by far not required to be constant but may depend on the datum to be transmitted. In yet other words, the signal transmitted may be different from a classic PWM signal (pulse width modulated signal).

Additionally or alternatively, the receiver circuit may be configured to determine the datum based on a size of the quantization step of the first time period between the first and third transitions being shorter than or equal to a size of the quantization step of the second time period between the first and second transitions concerning the additional datum. Due to the first and third transitions being transitions in the common first direction, it may be possible to limit hardware-related, fabrication-related and/or operation-related influences on the transitions. This may allow to determine the positions of the first and third transitions more accurately.

A sender according to an embodiment comprises a sender circuit to determine, based on a datum to be transmitted, a first time period between a first transition in a first direction and a third transition in the first direction of a signal to be generated. The sender circuit is further configured to modify, based on an additional datum to be transmitted, a predetermined second time period between the first transition and a second transition in a second direction of the signal, when the additional datum is different from a default value. The sender circuit is further configured to generate the signal comprising the first transition in the first direction, the second transition after the first transition in the second direction and the third transition after the transition in the first direction based on the first and second time periods.

Using a sender according to an embodiment may allow improving the previously mentioned trade-off between the robustness of the transmission scheme, the simplicity of a corresponding implementation and a higher throughput of data by using the time period between the first and third transitions to transmit the additional datum. Here, based on a predetermined second time period, the sender circuit of the sender may be capable of modifying this second time period, when the additional datum indicates a corresponding modification.

Optionally, the sender circuit may be configured to generate the signal comprising the first and third transitions as transitions from a common predefined first signal level to a common predefined second level. As outlined before, this may further increase the robustness of the transmission scheme and/or simplify an implementation of the sender.

Optionally, the sender circuit may be configured to modify the second time period—between the first transition and the second transition—being shorter than a minimum period of time after the first transition for a transition to the first level according to a predetermined or predefined specification or protocol for transmitting the datum, when the additional datum indicates the second time period to be shorter than the minimum time. In other words, it may be possible to implement the sender in such a way that it may violate a predefined protocol for transmitting the datum in order to even increase the data throughput further. This may, however, lead to a less compatible sender implementation. However, depending on the robustness of such a legacy implementation, it may be possible for such a receiver to simply ignore the modification of the second transition. This may allow a downward compatibility.

Additionally or alternatively, in such a sender the sender circuit may be configured to generate the signal comprising the second transition to an intermediate signal level different from the first signal level and the second signal level. This may further improve a downward compatibility by using the intermediate signal level being different from the first and second signal levels. Additionally or alternatively, it may allow increasing the bandwidth for the additional datum. In such an implementation, the second transition may be a transition, which does not end at the first and second signal levels. The intermediate signal level may be a signal level arranged between the first and second signal levels.

Additionally or alternatively, the sender circuit may be configured to further determine an amplitude for the second transition based on the additional datum from at least two different amplitudes for the second transition. The sender circuit may further be configured to generate the second transition of the signal with the determined amplitude for the second transition. As a consequence, it may be possible to increase the throughput of data even further by employing an amplitude modulation scheme for sending or transmitting the additional datum. For instance, by implementing the sender circuit to be capable of $2^n$ different amplitudes, n additional bits for the additional datum could be transmitted. Naturally, also non-$2^n$-multiple state sets of amplitude values may be used.

However, in other embodiments, the sender circuit may be configured to generate the second transition always comprising the same amplitude. As outlined, this may improve a compatibility and/or a robustness of the transmission scheme.

Additionally or alternatively, the sender circuit may be configured to determine the first time period based on the datum as a variable time period depending on the datum. In other words, the sender may be capable of not only transmitting one fixed piece of information as the datum, but to transmit one of several data by determining the appropriate variable first time period between the first and third transitions.

Additionally or alternatively, the sender circuit may be configured to determine the first time period between the first and third transitions for the datum based on the size of a quantization step being smaller than or equal to a size of a quantization step of the second time period between the first and second transitions concerning the additional datum. Due to the first and third transitions being transitions in the common first direction, it may be possible to limit hardware-related, fabrication-related and/or operation-related influences on the transitions. This may allow to determine the positions of the first and third transitions more accurately. A sender according to an embodiment may, therefore, be used to transmit simultaneously data according to a legacy specification and to transmit an additional datum to a receiver according to an embodiment capable of determining the additional datum Moreover, embodiments also comprise a transceiver comprising a sender and a receiver as described before. In such a case, the sender circuit and the receiver circuit may share common components used for both, sending and receiving the datum and/or the additional datum.

Furthermore, embodiments also comprise a method for retrieving an additional datum from a signal, wherein the method comprises receiving a first transition in a first direction, a second transition after the first transition and a second direction and a third transition after the second transition in the first direction of the signal, in which a first time period between the first and third transitions is at least partially indicating a datum to be received. The method further comprises determining a second time period between the first transition and the second transition and determining the additional datum to be received based at least on the determined second time period.

An embodiment also comprises a method for transmitting a datum and an additional datum in a signal, wherein the method comprises determining, based on the datum, a first time period between the first transition in a first direction and a third transition in the first direction of the signal. The method further comprises modifying, based on the additional datum, a predetermined second time period between the first transition and the second transition in a second direction of the signal, when a second datum is different from a default value. The method also comprises generating the signal comprising the first transition in the first direction, the second transition after the first transition in the second direction and the third transition after the second transition in the first direction based on the first and second time periods.

Embodiments also comprise a computer program having a program code for performing any of the methods as described before, when the computer program is executed on a computer, a processor or another programmable hardware.

Accordingly, an embodiment may also comprise both, a method for retrieving an additional datum from a signal and a method for transmitting a datum and an additional datum in a signal as described before. This also applies for the computer program according to an embodiment.

Embodiments further comprise a data transmission system comprising a receiver and a sender, at least one of which is implemented according to an embodiment, as well as a vehicle like a car comprising a control unit comprising a receiver or a transceiver and at least one sensor comprising a sender or a transceiver, as described in the context of the communication system.

BRIEF DESCRIPTION OF THE DRAWINGS

Several embodiments of the present disclosure will be described in the enclosed Figures.

DETAILED DESCRIPTION

Figure 1:
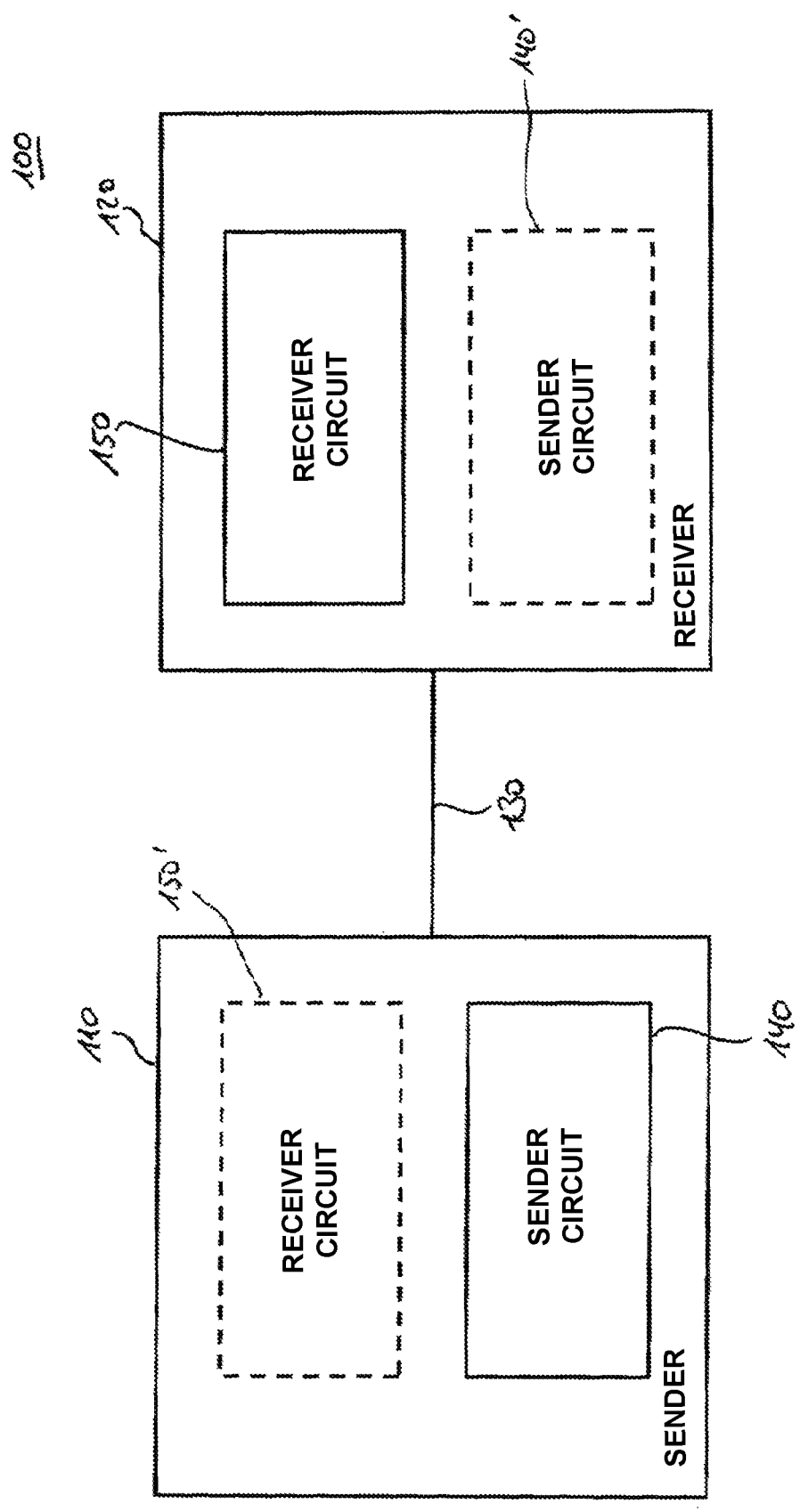
FIG. 1 shows a simplified block diagram of a data transmission system according to an embodiment.

In the following, embodiments according to the present disclosure will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

In many fields of technology, a demand exists to allow components of a system to transmit data from one component to another using a digital transmission scheme. Sometimes, the communication is not uni-directional, but a bi-directional communication allowing an exchange of data, commands, status information or the like. In the following description information to be transmitted from one component or entity to another component or entity will be referred to as data irrespective of the content or the meaning of the respective pieces of information.

In these applications often very different design goals have to be taken into consideration. However, in many cases, a robust transmission of data with respect to distortions, a simple implementation along with a high throughput of data represent important design goals. As a consequence, in many fields of applications a demand exists to improve a trade-off between these parameters.

Examples come, for instance, from high volume and/or low cost implementations, in which technically simple and, hence, cost efficient solutions may be important. For instance, in the field of components for an intra-vehicle communication, the individual components are often subjected to significant distortions while operating under difficult environmental influences. For instance, electromagnetic bursts may couple into electrical or electronic communication systems caused, for instance, by ignition systems, power control systems or the like.

However, even under these more difficult operational conditions, the components are often required to operate reliably and to be able to transmit and/or receive data with a sufficient high throughput rate to allow the individual components to operate properly and within their specified parameters. This may be important, as, for instance, safety-related system and components having a direct influence on the safety of the passengers of a vehicle may be involved.

An example comes, for instance, from the field of sensors and other electronic components of a motorized or non-motorized vehicle communicating with one another over the corresponding electrical network or bus system of the vehicle. Due to the number of different sensors comprised in a car, a motorcycle or a similar vehicle, the sensors and control units as well as other components are subjected to a corresponding cost pressure, favoring technically more simple solutions. Moreover, a simple solution may be more robust against distortions compared to more sophisticated protocols and implementations.

However, to limit the number of bus systems or communication systems in such a vehicle, the corresponding bandwidth or throughput concerning data to be transmitted via the communication system should be sufficiently high to prevent the need to establishing different communication systems. This may allow even to reduce the number of communication systems in such a vehicle.

Although in the example outlined above, a vehicle-related application scenario has been described, also in other fields of technology similar problems exist leading to similar demands. Without the loss of generality, in the following reference will be made to a vehicle-related application of a communication protocol and its associated infrastructure allowing, for instance, a sensor or another component of a car to communicate with a control unit or a similar other component.

In the following the communication protocol described may be implemented as an electrical communication protocol based on, for instance, an electrical voltage and/or an electrical current being modulated or changed to transmit the data. To be a little more specific, in the protocols described a datum is transmitted or received, which may comprise in principle any number of different states. However, in the following a bit-based transmission protocol will be described in more detail, in which a datum may comprise a specified number of bits, which translates into a corresponding number of different states. For instance, in the case of a nibble comprising 4 bits, 16 ($=2^4$) different states may be transmitted. However, the number of bits may be different in other embodiments. Moreover, it is by far not required to implement a bit-based transmission scheme. In principle, any number of states instead of a power of 2 ($2^n$, n being an integer) may be used.

Examples of corresponding protocols comprise, for instance, SPC (Short PWM Codes or SENT single-edge nibble transmission). Both of these protocols are based on a pulse width modulation (PWM) encoding scheme for the transmission of nibbles or multiples of nibbles, wherein each of the nibbles comprises four bits. In these examples the valuation is based only on falling edges. Although these protocols are comparably robust with respect to distortions, an achievable data rate is limited in the case of both protocols. Both protocols use, however, a quite long period in the nibble header, which is not used for data transmission. As will laid-out in more detail below, the initial phase of the nibble may be used to transmit at least one additional bit as an additional datum.

Although in the protocols mentioned only falling edges of the signal are used, in other embodiments also rising edges may be used to transmit a datum. As a consequence, in the following examples of the protocols will be described in terms of transitions in a first direction and a second direction, wherein the second direction is different from the first direction. In the case of a SPC implementation or a SENT implementation, the first direction may be a direction associated with a falling edge, while the second direction may be associated with a rising edge. As mentioned, in other embodiments the roles of falling and arising edges may be exchanged.

As will be outlined below, instead of an electric or electronic transmission scheme also other transmission schemes including, for instance, optical transmission schemes and magnetic transmission schemes may be used.

FIG. 1 shows a simplified block diagram of a data transmission system 100 according to an embodiment. The system 100 comprises a sender 110 and a receiver 120, which are coupled via a communication link 130, which may, for instance, comprise a bus for transmitting data at least in one direction. Naturally, in other embodiments the communication link 130 may comprise one or more individual data lines to allow data to be transmitted at least in one direction. Nevertheless, the communication link may also be implemented to be capable of transmitting data in both direction such that the communication link 130 is a bi-directional link establishing a bi-directional communication channel.

The sender 110 and the receiver 120 may be spatially separated from another and coupled via the communication link 130. Naturally, the sender 110 as well as the receiver 120 may be a part of a larger component for instance, a sensor, an electronic control unit (ECU) or a similar component of a vehicle such as a car, a truck or another motorized or non-motorized vehicle.

The sender 110 comprises a sender circuit 140, while the receiver 120 comprises a receiver circuit 150. The communication link 130 may be implemented as unidirectional communication link allowing data to be transmitted from the sender 110 to a receiver 120. However, instead of implementing only a sender 110 and a receiver 120, the two components may further comprise an optional receiver circuit 150' and an optional sender circuit 140', respectively, making the sender 110 and the receiver 120 transceivers capable of both, sending and receiving data. In this case, the communication link 130 may be implemented as a bidirectional communication link allowing exchanging data between the two components.

However, although in FIG. 1 the respective sender and receiver circuits 140, 150 are shown as distinct blocks, in a real-life implementation, the corresponding circuits may share at least partially components used for processing signals and data.

Figure 2:
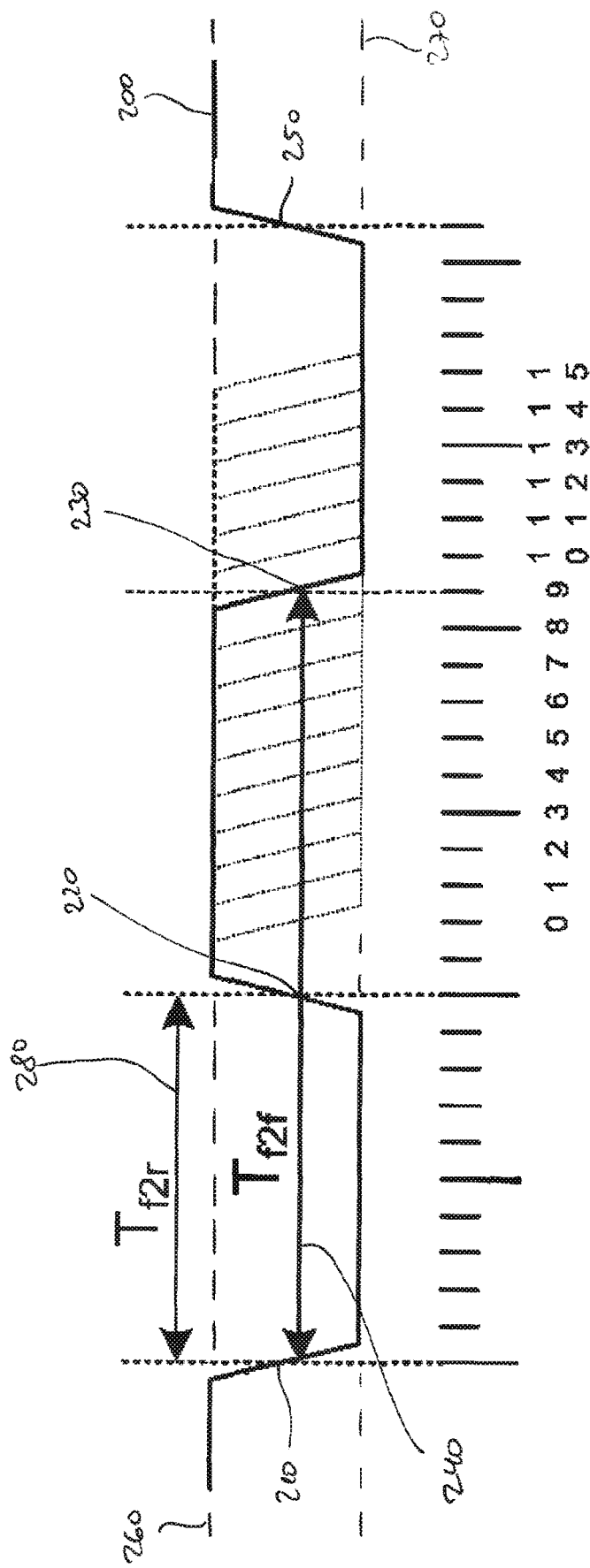
FIG. 2 illustrates a protocol for transmitting and/or receiving a datum.

FIG. 2 illustrates an example of a protocol for transmitting a datum from a sender 110 to a receiver 120 (not shown in FIG. 2). To be a little more specific, the protocol depicted in FIG. 2 is based on the SENT standard mentioned before. The protocol is based on a signal 200 experiencing transitions in different directions. In the example depicted in FIG. 2, the first direction corresponds to a falling edge of a signal 200, while a transition in the opposite second direction corresponds to a rising edge. In other examples, the directions may be interchanged.

The signal 200 comprises a first transition 210 in the first direction here corresponding to a falling edge of the signal 200. The signal 200 further comprises a second transition 220 after the first transition 210 in the second direction corresponding here to a rising edge of the signal 200. After the second transition 220, the signal 200 further comprises a third transition 230 again the first direction. As will be outlined in more detail with respect to the SENT protocol as well as the SPC protocol as one example, a first time period 240 ($T_{f2f}$; f2f=falling to falling edge) between the first and third transitions 210, 230 is at least partially indicating a datum to be transmitted or received.

Naturally, the signal 200 may further comprise a fourth transition 250 bringing the signal 200 back to a common first level 260. The first and third transitions 210, 230 may be implemented as transitions from the common predefined first signal level 260 to a common predefined second signal level 270. Depending on the protocol implemented, the different signal levels 260, 270 may correspond to different values of a voltage, a potential or a current in the case of an electric or electronic signal transmission scheme. Naturally, embodiments are by far not limited to electrical signal transportation, but may also be based on optical, magnetic or other transmission scheme. Depending on the corresponding transmission scheme, the levels may, for instance, be implemented as polarization levels, intensity levels in the case of optical transmission schemes or as magnetic field strength or magnetic field directions in the case of a magnetic transmission scheme.

By implementing a two-level protocol only, the robustness of the transmission scheme may eventually be better compared to a multi-level system, in which the transitions 210, 220, 230, 250 may assume more than just one specified amplitude in the case of a two level transmission scheme. Accordingly, the receiver circuit 150 of a receiver 120 or a corresponding transceiver may therefore be capable of determining in the first time 240 between the first transition 210 and the third transition 230 to determine the datum based at least on the determined first time period 240. Correspondingly, the sender circuit 140 may be capable to determine, based on the datum to be transmitted, the first time period 240 between the first transition 210 in the first direction and third transition 230 in the first direction of the signal 200 to be generated by the sender circuit 140.

In the protocol depicted in FIG. 2, the datum to be transmitted or to be received is encoded in the first time period 240, corresponding here to the time $T_{f2f}$ (falling to falling edge) between the falling edges of a first and third transitions 210, 230. Between the first and third transitions 230 the second transition 220 in the opposite or second direction is located. Between the first transition 210 and the second transition 220 in the example depicted in FIG. 2 the signal 200 assumes the second signal level 270. As a consequence, a second time period 280 between the first and second transitions 210, 220 is referred to in FIG. 2 as $T_{f2r}$ (falling to rising edge) indicating the time period between the falling edge of the first transition 210 (first direction) to the rising edge of the second transition 220 (second direction). However, it should be noted that the association of the first direction as the falling edge and the second direction as the rising edge can be easily switched in other examples. Moreover, it is by far not required for the signal to assume only two signal levels 260, 270 as depicted in FIG. 2.

In the example depicted in FIG. 2 the time periods 240, 280 are quantized on a timescale indicated in the lower part of FIG. 2. Here, the timescale is divided into bit times or ticks, which also represent the size of the quantization steps used to determine, for instance, the datum based on the first time period 240.

In conventional protocols such as the SENT standard or the SPC standard the low time or second time period 280 is specified to be longer than 4 bit times of 4 ticks. In other words, in some of the conventional standards the low time separating 2 nibbles is specified to be longer than four bit times. Naturally, in other specifications that minimum may be specified to be a different value.

Using the gap between the minimum length of four bit times or ticks and the last possible location of the second transition 220 (rising edge in FIG. 2), which is needed before the following third transition 230 (falling edge in FIG. 2) representing a value of 0 at, for instance, 12 bit times or ticks allows to add additional information. As will be outlined in more detail below, this downtime between the first and third transitions is used to transmit or receive the additional datum.

Depending on the implementation, a downward compatibility with the original standard may or may not be infringed depending on the concrete implementation. For instance, when the minimum time as indicated above is obeyed, a downward compatibility may be upheld, although a legacy receiver might not be capable of determining the additional datum. In other words, the downward compatibility is not necessarily infringed in the case of the original SENT standard, when the minimum time for a transition to the first level 260 is obeyed, since there is no restriction to the length of the initial low time as long as it has more than 4 bit times. For instance, by introducing a push-pull driver for an output of the sender 110, which may be connected to a sensor bus in a vehicle to give just one example, may guarantee a maximum length of a rising or falling edge of, for instance, 1 bit time or even less.

However, by violating the previously described minimum time for a transition to the first level 260 according to the specification for transmitting the datum, it may be possible to even transmit more information comprised in the additional datum. For instance, the receiver circuit may be configured to determine the second time period 280 between the first transition 210 and the second transition 220 as being shorter than the previously mentioned minimum time for the transition to the first level 260 according to the specification for transmitting the datum. Similarly, the sender circuit may be configured to modify the second time period 280 accordingly, when the additional datum to be transmitted indicates the second time period 280 to be shorter than the minimum time of the specification for transmitting the datum.

In the SENT standard the datum is a nibble comprising exactly four bits. In other words, sixteen different states can be transmitted in the SENT standard as the datum. Naturally, embodiments are by far not required such that the datum comprises four bits or a nibble. Different sizes for the datum may easily be implemented.

The sixteen different states 0, 1, 2, . . . 15 are encoded in the first time period 240 as an additional time period corresponding directly to the number of ticks, which is added to the previously mentioned offset of 12 bit times or 12 ticks. For instance, the nibble value 0 corresponds to the first time period 240 to be 12 ticks long. A nibble value of 7 corresponds to 19 bit times or ticks for the first time period 240. Similarly, the value 15 for the nibble corresponds to a first time period 240 of 27 (=12+15) ticks or bit times.

In other words, the first time period 240 between the first and third transitions 210, 230 is variable and depending on the datum to be transmitted or received. Accordingly, the receiver circuit may be configured to determine the datum based on this variable time period. Similarly, the sender circuit may be configured to determine the first time period based on the datum as a variable time period depending on the datum.

FIG. 2 below the time index the different values of the datum are depicted below the respective ticks or bit times. Moreover, as dotted lines different third transitions 230 are illustrated, although in FIG. 2 for the sake of simplicity only one is marked with the reference sign 230. The third transition 230 marked in FIG. 2 corresponds to the nibble value 9 at 21 ticks or bit times.

As FIG. 2 illustrates, the protocol used here is an asynchronous transmission scheme, which does not require a clock signal to be transmitted in parallel. A synchronization and a common time basis may be established by including a synchronization frame or synchronization data to the signal 200.

Figure 3:
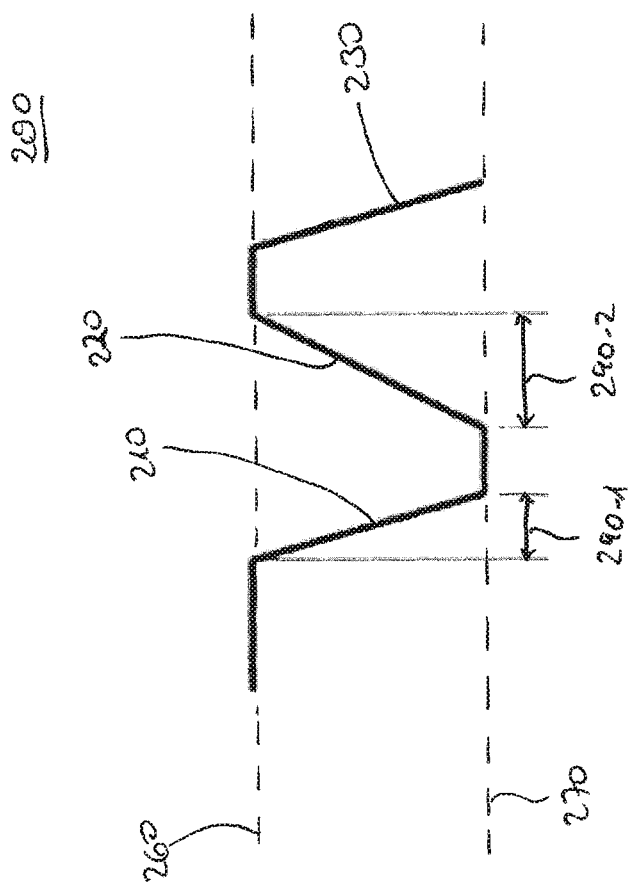
FIG. 3 illustrates an asymmetry of a signal with respect to transitions in a first direction and a second direction.

FIG. 3 shows a schematic diagram of a signal 200 comprising once again a first transition 210, a second transition 220 and a third transition 230 between the first level 260 and a second signal level 270. As outlined before, the first transition 210 and the third transition 230 are transitions along the first direction, while the second transition 220 is a transition in the opposite or second direction.

FIG. 3 however illustrates an effect, which is often encountered in implementations. The time of the transitions in the first and second directions often deviate from one another. For instance, a duration 290-1 for a transition in the first direction (here the first transition 210) may be shorter than a duration 290-2 for a corresponding transition into the opposite, second direction (here second transition 220). This may, for instance, be caused by a not fully symmetric implementation of the driver circuits of the sender circuit 140 generating the signal 200. For instance, in the SENT standard the maximum fault time is specified to be utmost 6.5 µs, while a maximum rise time is 18.0 µs.

Due to this accepted and to some extent even anticipated asymmetry of the edges or transitions into the different directions, conventionally transitions along the same direction are used to determine a datum to be transmitted or received. This may simplify an implementation of the corresponding sender or receiver circuits 140, 150 since, for instance, signal levels used to determine the presence of a transition lead to more evenly distribute time differences with respect to the signal 200 leaving the starting signal level. In other words, since the first and third transitions 210, 230 are transitions in the same direction, signal level used by a concrete receiver circuit 150 to determine the presence of a transition is assumed more consistently with respect to the point of time, when the signal 200 leaves the first signal level 260. Using transitions along different directions may require additional calibration or a more complex implementation, which may be considered less favorable in view of a simple implementation. However, by implementing a push-pull-driver in the sender circuit 140 the asymmetry between the transitions into the first and second direction may be reduced without a significant increase in terms of the complexity of the implementation.

Figure 4:
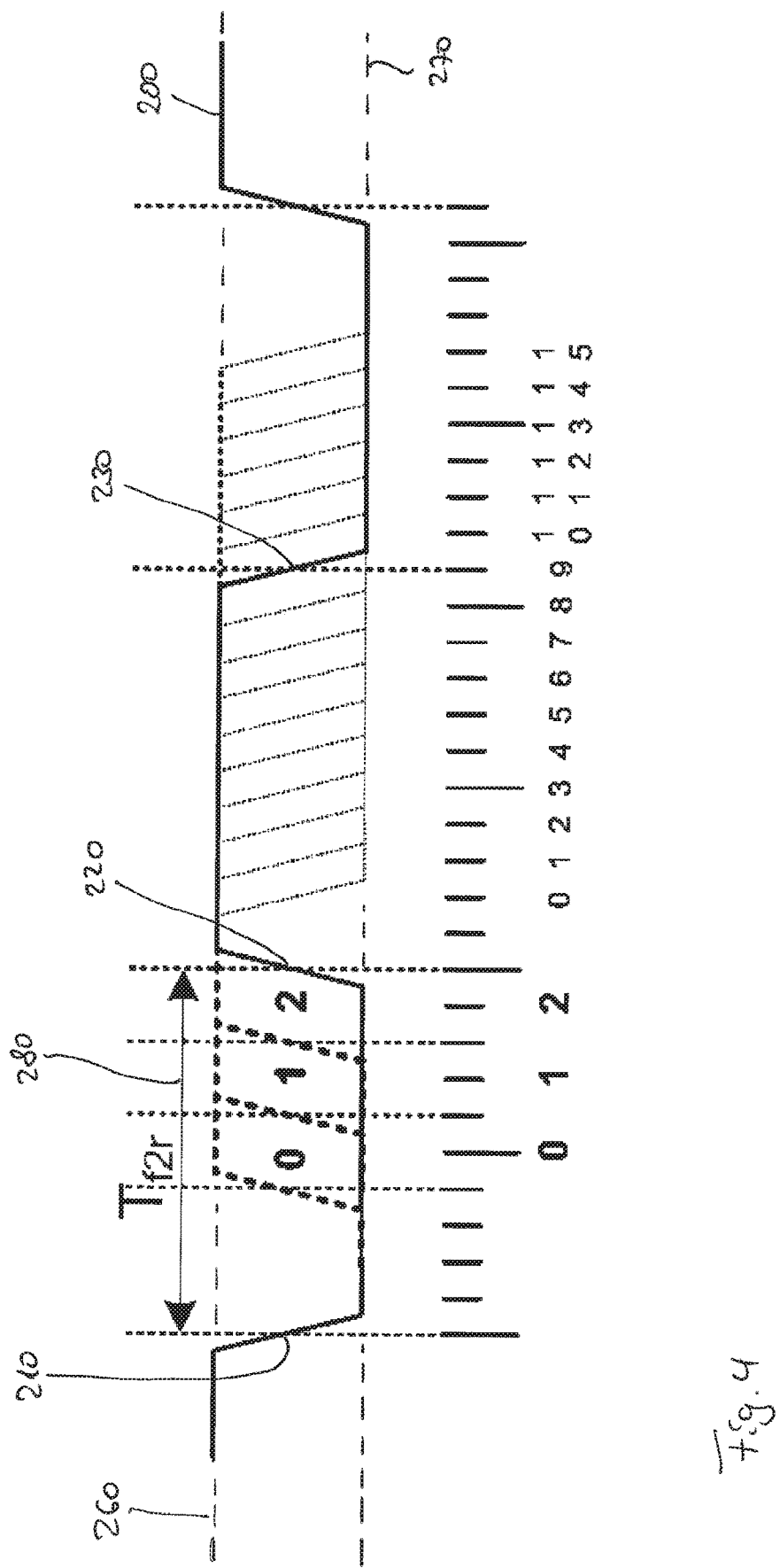
FIG. 4 illustrates a protocol used by a receiver and/or a sender according to an embodiment.

FIG. 4 shows a diagram similar to the one depicted in FIG. 2. However, in FIG. 4 the second time period 280 ($T_{f2r}$) between the first and second transitions 210, 220 is also variable and indicative of the additional datum to be transmitted. To illustrate this, FIG. 4 shows as dashed lines four different transitions along the second direction (rising edge in FIG. 4) from the second signal level 270 to the first signal level 260. Here, the second time period Tf2r indicated in FIG. 4 refers to a second transition 220 corresponding to a "limiting" position of the second transition 220 ensuring in the implementation depicted in FIG. 4 that the following third transition 230 can even safely be implemented when the datum assumes the value 0 as indicated once again in the lower part of FIG. 4.

However, to be a little more specific, in the examples depicted in FIG. 4 the second time period 280 can be varied between four bit times or ticks to ten ticks or bit times. Due to a possible asymmetry, which may, however, be limited using corresponding driver technologies for the sender circuit 140, in the examples depicted here a size of the quantization steps for the additional datum is chosen to be 2 ticks or 2 bit times. In other words, the size of the quantization steps for the additional datum are, here, twice as large as the quantization steps for the datum. In the example depicted in FIG. 4, the working principle of this protocol extension uses the rising edge (second transition 220) within the nibble transmission to appear in a time window of 4 to 6, 6 to 8 or 8 to 10 ticks or bit times allowing three different values of the additional datum to be transmitted. The values are here indicated as 0 for the time window 4 to 6 ticks, 1 for the bit times 6 to 8 and 2 for the bit times 8 to 10. The time windows are assigned to these three different values for the additional transmitted information.

The implementation depicted in FIG. 4 corresponds to a more conservative design, taking into account that the rising and falling edges may have different slopes. As a consequence, in this example it is assumed that the separation of the symbols may be chosen to be larger than for the standard time where window of, for instance, the SENT or SPC transmission scheme, which is defined here by two adjacent falling edges. This example uses the assumption that the new additional data, which may also be referred to as a sub-nibble, has the same or a better signal-to-noise-ratio (SNR) than the standard SENT or SPC nibble.

To retrieve the additional datum, the receiver circuit may be capable of determining the second time period 280 between the first transition 210 and the second transition 220 and to determine the additional datum received based at least partially on the determined second time period 280 between the mentioned transitions 210, 220. Similarly, the sender circuit 140 of the sender 110 may be capable to modify based on the additional datum to be transmitted, the predetermined second time period (for instance 10 ticks in the example of FIG. 4) between the first transition 210 and the second transition 220 of the signal 200, when the additional datum is different from a default value (for instance 2 in the example of FIG. 4) or indicating a corresponding modification.

A sender circuit may then generate the signal 200 based on the first time period for the datum and the optionally modified second time period 280 for the additional datum. In other embodiments there might be a higher or lower safety margin for the time measurement. For instance, it may be advisable to implement the sender 110 and the receiver 120 such that the additional datum only comprises a single bit, which may, for instance, be encoded by associating the value 0 to the bit times or ticks 4 to 7 and the value 1 to the bit times or ticks 7 to 10. However, in other embodiments it is by far not required to use integer bit times since, for instance, the receiver may comprise a microcontroller, which may have a much higher time resolution. Similarly, also the sender 110 may comprise a similar microcontroller-based circuit allowing a much finer resolution. For instance, in the case of a 2 bit comprising additional datum the bit times 4 to 5.5 may be assigned to the value 0, the bit times or ticks 5.5 to 7 may be assigned to the value 1, the bit times or ticks 7 to 8.5 may be assigned to the value 2 and the bit times or ticks 8.5 to 10 may be assigned to the value 3. Similarly, even more states may be transmitted as the additional datum. For instance, the bit times 4 to 5.5 may be associated with the value 0, bit times 5.5 to 7 with the value 1, 7 to 8.5 to the value 2, 8.5 to 10 to the value 3, and values 10 to 11.5 to the value 4.

In implementations, the quantization step size for the additional datum may be equal to or larger than the corresponding quantization step size for the datum. For instance, the quantization of the second time period may be chosen to be larger than the one of the first time period, since the first period may be measured between transitions in the common first direction, such as two falling edges. Thus, these transitions may be less dependent or even independent of hardware parameters, while the second period is measured between transitions in opposite directions, for instance, between a falling edge and a rising edge. These transitions may, hence, depend differently on asymmetries, temperature variations and supply voltage dependencies of possible pull-up and pull-down drive circuitry and a load setup. In other words, the time period between two transitions in a common direction, such as two falling edges, may be more precise due to matching than the one between—irrespective of the order—a falling and a rising edge, since the two edges may have different spreads depending on fabrication parameters and operation conditions.

The size of quantization steps for the additional datum may even be smaller than the size of the quantization steps for the datum. As a consequence, it may be possible to transmit the additional datum comprising the same amount of information as the datum or even with a higher information content. This may additionally be increased by using an amplitude modulation scheme wherein the receiver circuit 150 and the sender circuit 140 are capable of determining the amplitude of a second transition 220 and to determine the additional datum based on the determined amplitude of the second transition 220 or generate a corresponding signal 200, respectively. In the case of an amplitude modulation scheme, the amplitudes may comprise at least two different amplitudes. However, in distortion rich environments the previously described implementation of smaller quantization step sizes as well as an amplitude modulation scheme may be less favorable. In such a case it may, for instance, be more interesting to implement the circuits such that the second transition 220 always comprises the same amplitude as the first transition 210 and/or the third transition 230.

As outlined before the downward compatibility with protocols such as SENT or SPC may be sacrificed such that the additional datum and the code comprised therein may even start below the previously mentioned four bit times. Naturally, the additional datum may be used as an error detection code or an error correction code including, for instance, a redundancy code. In other words, besides increasing the transmitted used data to other applications, the new data bits of the additional datum may be transmitted to be used as a redundancy code for the following nibble in, for instance, the SENT protocol or the SPC protocol. Naturally, it may be advisable to use as many receivers 120 as possible using the specified extension of this protocol. It may allow an increase of the data rate due to the shorter bit times made possible.

Figure 5:
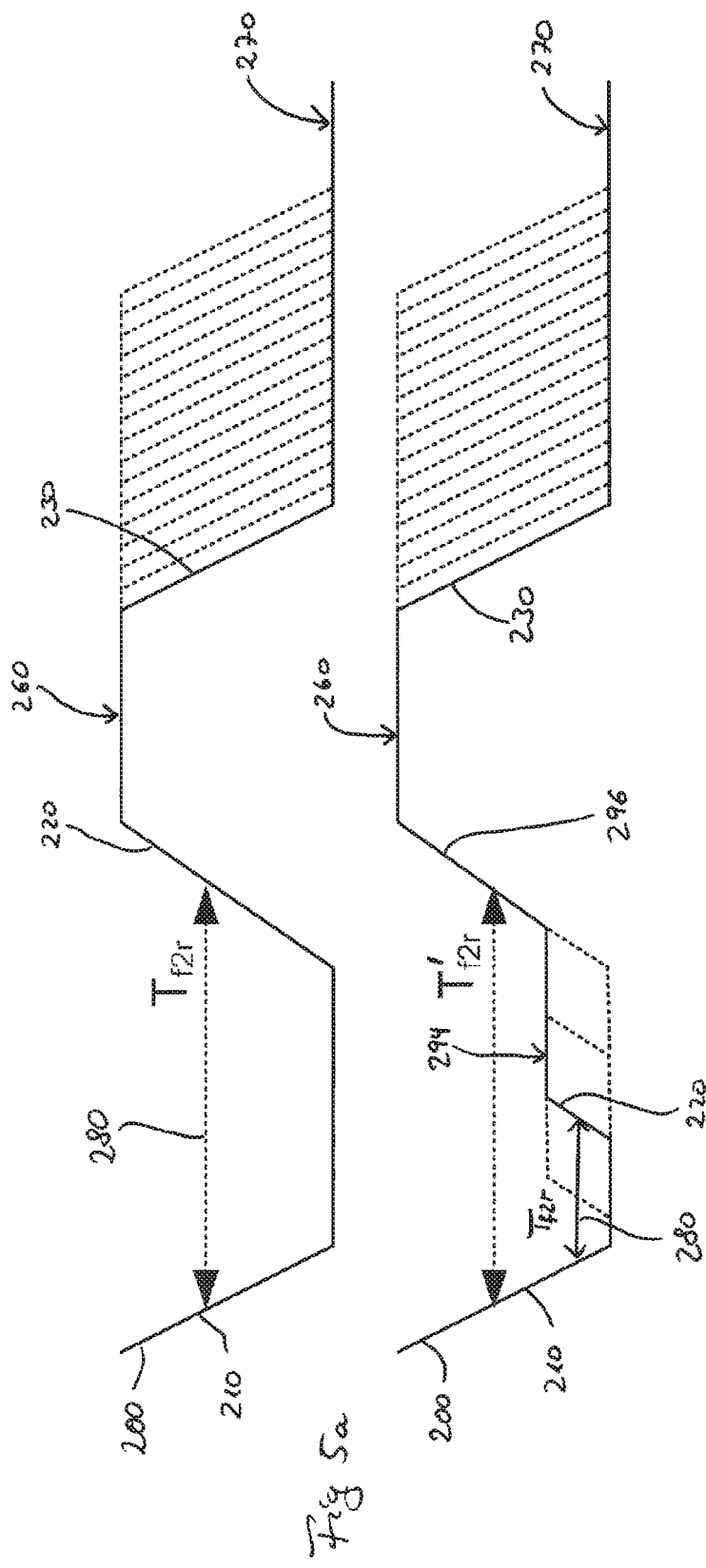
FIG. 5A illustrates a protocol for transmitting and/or receiving a datum.
FIG. 5B illustrates a protocol used by a receiver and/or a sender according to an embodiment, in which the second transition comprises a different amplitude.

FIG. 5a illustrates an example of a protocol for transmitting a datum from a sender 110 to a receiver 120 (not shown in FIG. 5a), which resembles the diagram of FIG. 2. Again, the protocol depicted in FIG. 5a is based on the SENT standard and, hence, illustrates a standard shape of the PWM signal 200. Here, the second transition 220 brings the signal 200 from the second signal level 270 back to the first signal level 260.

FIG. 5b shows an example of a protocol for transmitting not only a datum, but also an additional datum from a sender 110 to a receiver 120 (not shown in FIG. 5b). The signal 200 comprises a first transition 210, which transfers the signal level of the signal 200 from the first signal level 260 to the second signal level 270, where the signal is constant for a period of time. The second transition 220 transfers the signal level from the second signal level 270 to an intermediate signal level 294. The intermediate signal level 294 may be in between the first and second signal levels 260, 270 and, for instance, used to differentiate the signal level used for encoding the additional datum from the signal level (first signal level 260) used to encode the datum.

However, in another embodiment, the intermediate signal level 296 may be one signal level used to further increase the available bandwidth by employing an amplitude-modulation-like technique. A difference between the second signal level 270 and the intermediate signal level 294 may be one amplitude, the sender circuit 140 can choose from, when determining the amplitude for the second transition 220 based on the additional datum. In this case, a difference between first signal level 260 and the second signal level 270 may represent another amplitude the sender circuit may use to encode the additional datum.

The second transition 220 is followed by a phase with a constant signal level (intermediate signal level 294), before the signal 200 comprises a further second transition 296, in the course of which the signal level is transferred to the first signal level 260. A time period between the first transition 210 and the further second transition 296 ($T'_{p2r}$) may also be determined, for instance, to verify timing requirements or other parameters.

Hence, FIG. 5b shows a pulse width modulated signal 200 with different amplitude.

Figure 6:
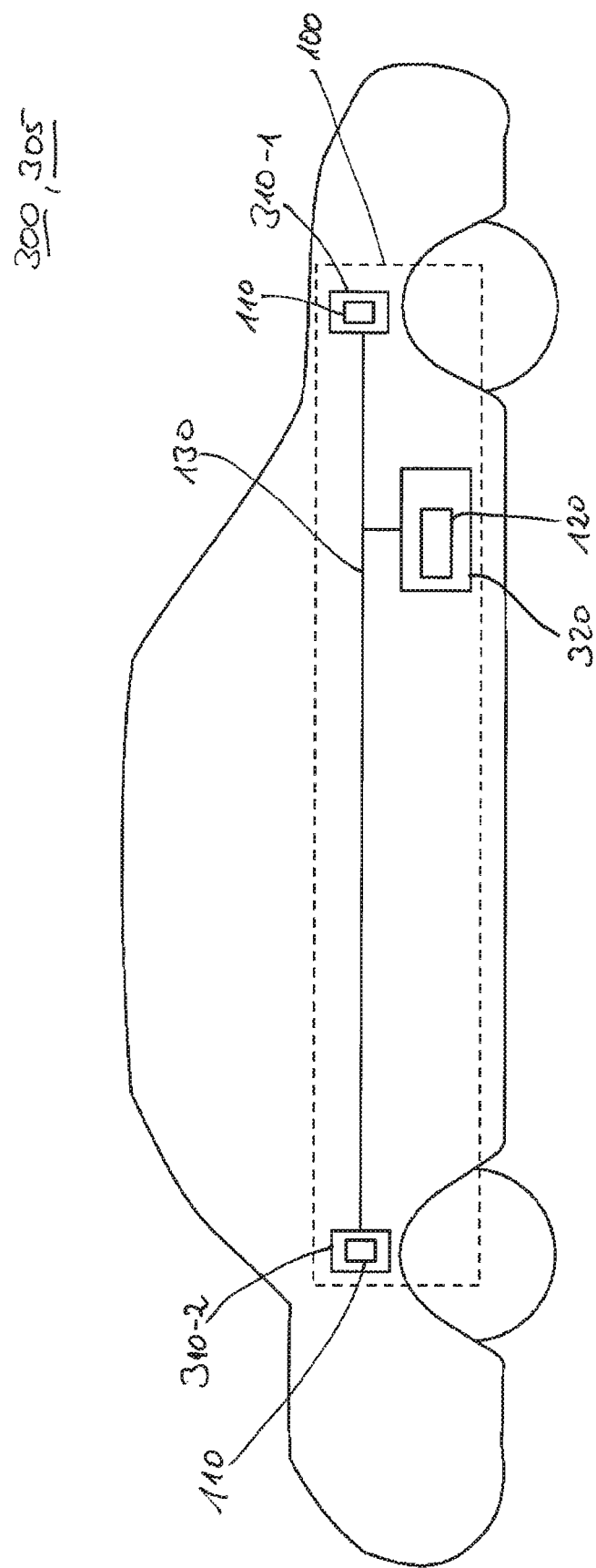
FIG. 6 shows a schematic block diagram of a vehicle comprising a data transmission system according to an embodiment.

FIG. 6 shows a schematic block diagram of a possible application according to an embodiment. This figure shows a vehicle 300 in the form of a car 305 comprising a data transmission system 100 comprising at least one sensor 310 and an electronic control unit or controller 320. To be a little more specific, the vehicle 300 of FIG. 6 comprises at least two sensors 310-1, 310-2 which may be wheel speed sensors or other sensors used. The sensors 310 are coupled to the controller 320 via a communication link 130, which may be implemented as a bus to name just one example. Each of the sensors 310 comprises at least a sender 110 to allow the sensors 310 to provide the controller 320 with sensor data. Accordingly, the controller 320 comprises at least a receiver 120 to allow the data including the additional data sent by the sensors 310 to be determined. Hence, embodiments may comprise, for instance, SPC-compatible sensor interfaces for transmitting additional information in the low phase of a signal 200.

Figure 7:
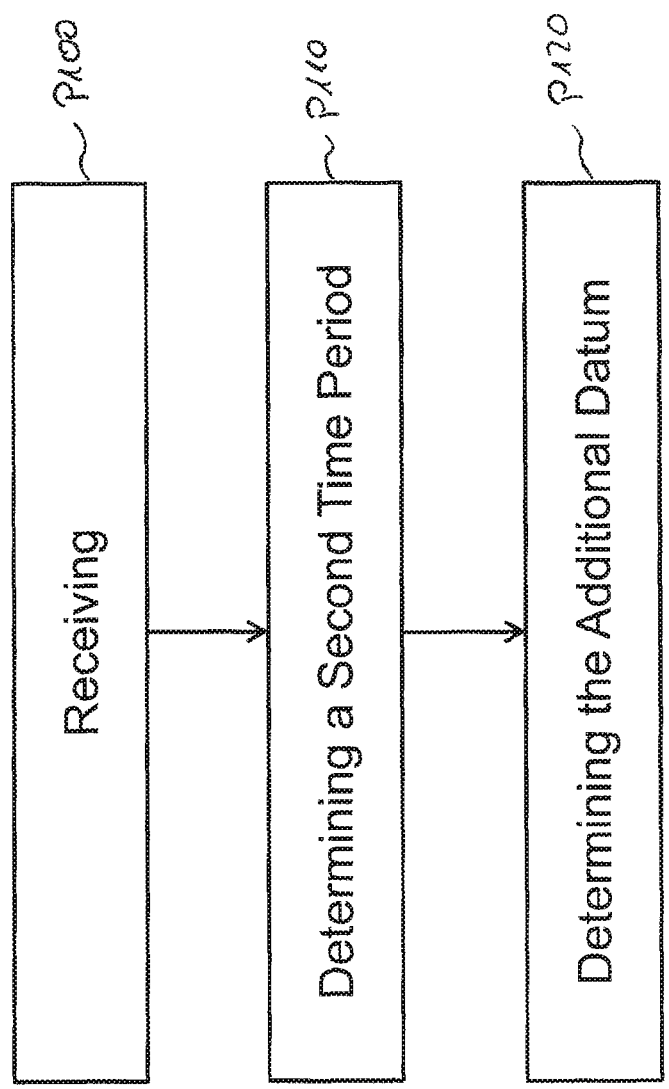
FIG. 7 shows a flowchart of a method for retrieving an additional datum from a signal according to an embodiment.

FIG. 7 shows a flowchart of a method for retrieving an additional datum from a signal 200. The method comprises in a process P100 receiving a first transition 210 in a first direction, a second transition 220 after the first transition 210 in a second direction and a third transition 230 after the second transition 220 in the first direction of the signal 200. A first time period 240 between the first and third transitions 210, 230 is at least partially indicating a datum to be received.

In a process P110, the method further comprises determining a second time period 280 between the first transition 210 and the second transition 220. In a process P120 the additional datum to be received is determined at least partially on the determined second time period 280.

Figure 8:
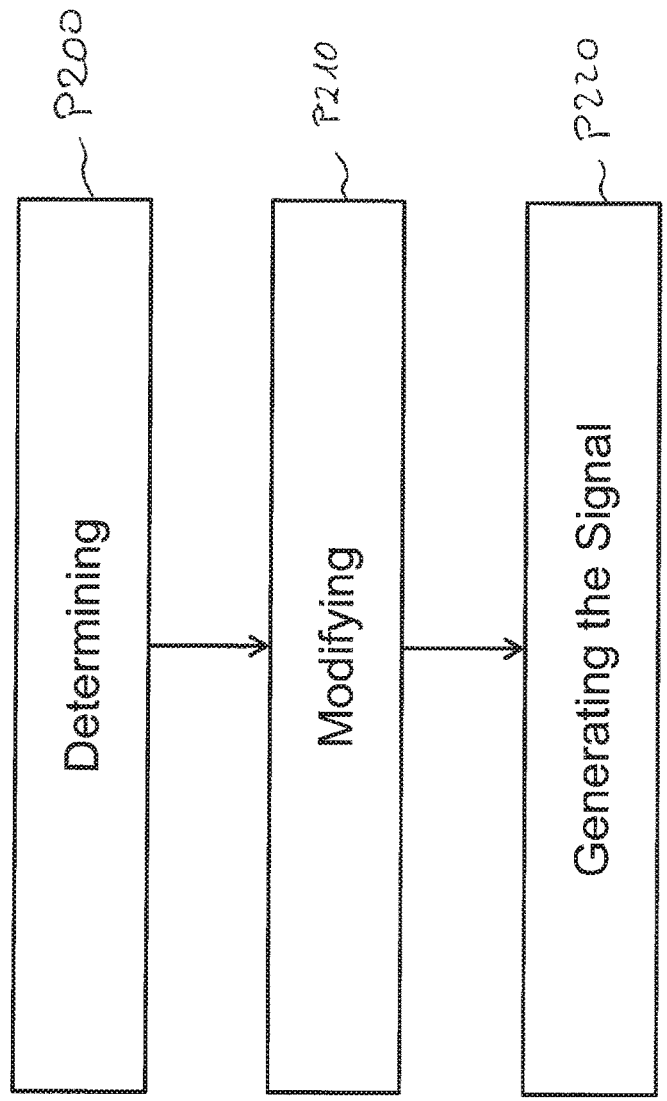
FIG. 8 shows a flowchart of a method for transmitting a datum and an additional datum and a signal according to an embodiment.

Similarly, FIG. 8 shows a flowchart of a method for retrieving an additional datum from a signal 200 according to an embodiment. In a process P200 a first time period 240 between a first transition 220 in a first direction and a third transition 230 in the first direction of a signal 200 is determined based on the datum to be transmitted. In a process P210 a predetermined second time period between the first transition 210 and the second transition 220 in the second direction of the signal 200 is modified. This may, for instance, be done, when the additional datum is different from a default value.

In a process P220 the signal 200 comprising the first transition 210 in the first direction, the second transition 220 after the first transition 210 in the second direction and the third transition 230 after the second transition 220 in the first direction is generated based on the first and second time periods 240, 280.

Naturally, the order of the processes is by far not restricted to the order depicted in the figures or the description. The order of execution of the processes may differ in embodiments. Moreover, the processes may be executed overlapping in time or even simultaneously. They may also be repeated and, for instance, be executed in a loop, until a specified condition is fulfilled.

Naturally, as outlined before, embodiments may also comprise a computer program having a program code for performing any of the method described, when the computer program is executed on a computer, a processor or another programmable hardware. Such a programmable hardware may, for instance, comprise a controller 230 for a car 305, but also a sensor 310 or another device.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured for performing or to perform a certain function, respectively. Hence, a "means for s.th." may as well be understood as a "means being configured or suited for s.th.". A means being configured for performing a certain function does, hence, not imply that such means necessarily is performing said function (at a given time instant).

The methods described herein may be implemented as software, for instance, as a computer program. The sub-processes may be performed by such a program by, for instance, writing into a memory location. Similarly, reading or receiving data may b e performed by reading from the same or another memory location. A memory location may be a register or another memory of an appropriate hardware. The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective processes of these methods.

Further, it is to be understood that the disclosure of multiple processes or functions disclosed in the specification or claims may not be construed as to be within the specific order. Therefore, the disclosure of multiple processes or functions will not limit these to a particular order unless such processes or functions are not interchangeable for technical reasons.

Furthermore, in some embodiments a single process may include or may be broken into multiple sub-processes. Such sub-processes may be included and part of the disclosure of this single process unless explicitly excluded.

What is claimed is:

1. A receiver, comprising:
a receiver circuit configured to receive a message comprising a plurality of nibbles,
wherein at least one of the nibbles comprises a signal waveform comprising a first transition in a first direction, a second transition after the first transition in a second, different direction, and a third transition after the second transition in the first direction of a signal, wherein the receiver circuit is configured to determine a datum associated with the at least one of the nibbles of the received message based at least in part on a first time period between the first transition and the third transition, wherein the receiver circuit is further configured to
determine an additional datum associated with the at least one of the nibbles of the received message based at least in part on a second time period between the first transition and the second transition,
wherein the first time period is one of to a plurality of different available values and is indicative of the datum, and
wherein the second time period is one of a plurality of different available values and is indicative of the additional datum.

2. The receiver according to claim 1, wherein the receiver circuit is configured to determine the first transition and the third transition as transitions from a common predefined first signal level to a common predefined second signal level, wherein the common predefined first signal level is greater than the common predefined second signal level, or the common predefined first signal level is less than the common predefined second signal level.

3. The receiver according to claim 2, wherein the receiver circuit is configured to determine the second time period being shorter than a minimum period of time after the first transition for a transition to the first level according to a single-edge nibble transmission (SENT) specification or a short pulse width modulation (PWM) codes (SPC) specification for transmitting the datum.

4. The receiver according to claim 2, wherein the receiver circuit is configured to determine the second time period based on the second transition to an intermediate signal level between the common predefined first signal level and the common predefined second signal level.

5. The receiver according to claim 1, wherein the receiver circuit is configured to determine the second time period between the first and second transitions based on an amplitude of the second transition, and wherein the receiver circuit is configured to determine the additional datum based on at least two different amplitudes of the second transition.

6. The receiver according to claim 1, wherein the receiver circuit is configured to determine the second time period between the first and second transitions based on the second transition always comprising the same amplitude.

7. The receiver according to claim 1, wherein the receiver circuit is configured to determine the datum based on a size of a quantization step of the first time period between the first and third transitions being smaller than or equal to a size of a quantization step of the second time period between the first and second transitions concerning the additional datum.

8. A sender, comprising:
a sender circuit configured to
determine, based on a datum to be transmitted, a first time period between a first transition in a first direction ad a third transition in the first direction of a signal portion associated with a single nibble to be generated;
wherein the sender circuit is configured to
determine, based on an additional datum to be transmitted, a second time period between the first transition and a second transition in a second, different direction of the signal portion, when the additional datum is different from a default value;
wherein the first time period is one of a plurality of different available values and is indicative of the datum;
wherein the second time period is one of a plurality of different available values and is indicative of the additional datum; and
wherein the sender circuit is further configured to generate the signal portion comprising the first transition in the first direction, the second transition after the first transition in the second direction, and the third transition after the second transition in the first direction based on the determined first and second time periods.

9. The sender according to claim 8, wherein the sender circuit is configured to generate the signal comprising the first and third transitions as transitions from a common predefined first signal level to a common predefined second level, wherein the common predefined first signal level is greater than the common predefined second signal level, the common predefined first signal level is less than the common predefined second signal level.

10. The sender according to claim 9, wherein the sender circuit is configured to determine the second time period by modifying a predetermined second time period to be shorter than a minimum period of time after the first transition for a transition to the first level according to a single-edge nibble transmission (SENT) specification or a short pulse width modulation (PWM) codes (SPC) specification for transmitting the datum, when the additional datum indicates the determined second time period being shorter than the minimum time.

11. The sender according to claim 9, wherein the sender circuit is configured to generate the signal portion comprising the second transition to an intermediate signal level between the common predefined first signal level and the common predefined second signal level.

12. The sender according to claim 8, wherein the sender circuit is configured to further determine an amplitude for the second transition based on the additional datum from at least two different amplitudes for the second transition, and wherein the sender circuit is configured to generate the second transition of the signal portion with the determined amplitude for the second transition.

13. The sender according to claim 8, wherein the sender circuit is configured to generate the second transition always comprising the same amplitude.

14. The sender according to claim 8, wherein the first time period is based on a substantive content of the datum.

15. The sender according to claim 8, wherein the sender circuit is configured to determine the first time period between the first and third transitions for the datum based on a size of a quantization step being smaller than or equal to a size of a quantization step of the second time period between the first and second transitions concerning the additional datum.

16. A method for retrieving a datum and an additional datum from a single nibble portion of a signal, the method comprising:
receiving a first transition of the signal portion in a first direction, a second transition of the signal portion after the first transition in a second, different direction and a third transition of the signal portion after the second transition in the first direction of the signal portion, wherein a first time period between the first transition and the third transition of the signal portion is at least partially indicative of the datum to be received, and wherein the first time period is one of a plurality of different available values;
determining a second time period between the first transition and the second transition of the signal portion, wherein the second time period is one of a plurality of different available values; and
determining the additional datum to be received based at least on the determined second time period.

17. A method for transmitting a datum and an additional datum in a single nibble portion of a signal, the method comprising:
determining, based on the datum, a first time period between a first transition of the signal portion in a first direction and a third transition of the signal portion in the first direction, wherein the first time period is one of a plurality of different available values;
determining, based on the additional datum, a second time period between the first transition of the signal portion and a second transition of the signal portion in a second, different direction, wherein the additional datum is different from a default value, and wherein the second time period is one of a plurality of different available values; and
generating the signal portion comprising the first transition in the first direction, the second transition after the first transition in the second direction, and the third transition after the second transition in the first direction based on the determined first and second time periods.

18. The method of claim 17, wherein determining the second time period comprises modifying a predetermined second time period based on the additional datum.

19. The method of claim 16, wherein the first transition and the third transition are transitions from a common predefined first signal level to a common predefined second signal level, wherein the common predefined first signal level is different than the common predefined second signal level, and wherein the second transition is based on a transition from the common predefined second signal level to an intermediate signal level, and wherein the intermediate signal level is between the common predefined first and second signal levels.

20. The method of claim 17, wherein the first transition and the third transition are transitions from a common predefined first signal level to a common predefined second signal level, wherein the common predefined first signal level is different than the common predefined second signal level, and wherein the second transition is based on a transition from the common predefined second signal level to an intermediate signal level, and wherein the intermediate signal level is between the common predefined first and second signal levels.

* * * * *